(12) United States Patent
Black

(10) Patent No.: US 9,331,213 B2
(45) Date of Patent: May 3, 2016

(54) INTEGRATED POWER CONNECTORS FOR PV MODULES AND THEIR METHODS OF MANUFACTURE

(71) Applicant: First Solar, Inc., Tempe, AZ (US)

(72) Inventor: Stacy Ann Black, Longmont, CO (US)

(73) Assignee: First Solar, Inc., Tempe, AZ (US)

( * ) Notice: Subject to any disclaimer, the term of this patent is extended or adjusted under 35 U.S.C. 154(b) by 268 days.

(21) Appl. No.: 13/873,317

(22) Filed: Apr. 30, 2013

(65) Prior Publication Data

US 2014/0318602 A1 Oct. 30, 2014

(51) Int. Cl.
| | |
|---|---|
| *H01L 31/0445* | (2014.01) |
| *H01L 31/02* | (2006.01) |
| *H02S 40/34* | (2014.01) |
| *H02S 40/36* | (2014.01) |
| *H01R 13/518* | (2006.01) |
| *H01R 13/516* | (2006.01) |
| *H01R 13/514* | (2006.01) |
| *H01R 13/506* | (2006.01) |

(52) U.S. Cl.
CPC .......... *H01L 31/02013* (2013.01); *H02S 40/34* (2014.12); *H02S 40/36* (2014.12); *H01R 13/506* (2013.01); *H01R 13/514* (2013.01); *H01R 13/516* (2013.01); *H01R 13/518* (2013.01); *Y02E 10/50* (2013.01)

(58) Field of Classification Search
CPC .......... H01L 31/05–31/0512; H01L 31/02013; H01R 13/40–13/6456; Y02E 10/50
USPC .................................. 136/343–265; 439/701
See application file for complete search history.

(56) References Cited

U.S. PATENT DOCUMENTS

| | | | |
|---|---|---|---|
| 4,310,211 A * | 1/1982 | Bunnell ............. | H01R 13/5205 136/244 |
| 5,268,038 A | 12/1993 | Riermeier et al. | |
| 5,503,684 A | 4/1996 | Duran | |
| 5,513,075 A * | 4/1996 | Capper ................ | H01R 4/2441 361/773 |
| 7,641,522 B2 * | 1/2010 | Carcangiu ............. | H01R 4/366 439/271 |
| 8,187,016 B2 | 5/2012 | Vijh et al. | |
| 2007/0287322 A1 | 12/2007 | Machado et al. | |
| 2010/0200045 A1 * | 8/2010 | Mitchell ........................ | 136/246 |
| 2010/0258157 A1 * | 10/2010 | Arai ............................... | 136/244 |
| 2011/0186113 A1 * | 8/2011 | Nishi et al. ..................... | 136/251 |
| 2011/0212640 A1 | 9/2011 | Lange et al. | |
| 2011/0220180 A1 * | 9/2011 | Cinnamon et al. ............. | 136/251 |
| 2012/0023842 A1 * | 2/2012 | Wang et al. .................. | 52/173.3 |
| 2012/0024337 A1 * | 2/2012 | Bellacicco et al. ........... | 136/244 |

(Continued)

*Primary Examiner* — James Lin
*Assistant Examiner* — Liesl C Baumann
(74) *Attorney, Agent, or Firm* — MacMillan, Sobanski & Todd, LLC

(57) ABSTRACT

Photovoltaic devices are provided that include a thin film stack (of a plurality of photovoltaic cells connected in series to each other) on a transparent substrate, a first busbar electrically connected to the first terminal cell, and a second busbar electrically connected to the second terminal cell. An encapsulation substrate is on the plurality of thin film layers and defines a first connection aperture positioned over the first busbar and a second connection aperture positioned over the second bus bar. A first electrical connector is positioned on the encapsulation substrate and is electrically connected to the first busbar through the first connection aperture, and a second electrical connector is positioned on the encapsulation substrate and is electrically connected to the second busbar through the second connection aperture. Solar arrays and kits are also provided that include such photovoltaic devices and a connection cable.

14 Claims, 9 Drawing Sheets

(56) References Cited

U.S. PATENT DOCUMENTS

2012/0073623 A1* 3/2012 Jones et al. .................. 136/245
2012/0264319 A1* 10/2012 Chikano ....................... 439/248
2013/0098420 A1* 4/2013 Sherman et al. .............. 136/244
2014/0041715 A1* 2/2014 Carolan et al. ................ 136/251

* cited by examiner

US 9,331,213 B2

INTEGRATED POWER CONNECTORS FOR PV MODULES AND THEIR METHODS OF MANUFACTURE

FIELD OF THE INVENTION

The subject matter disclosed herein relates generally to photovoltaic (PV) devices including an integrated power connector for collecting the power (current and voltage) from the PV devices.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. The junction of the n-type layer (e.g., CdS) and the p-type layer (e.g., CdTe) is generally responsible for the generation of electric potential and electric current when the CdTe PV module is exposed to light energy, such as sunlight. A transparent conductive oxide ("TCO") layer is commonly used between the window glass and the junction forming layers to serve as the front electrical contact on one side of the device. Conversely, a back contact layer is provided on the opposite side of the junction forming layers and is used as the opposite contact of the cell.

An encapsulation substrate is positioned on the opposite side of the device from the window glass to encase the thin film layers. The encapsulation substrate also serves to mechanically support the window glass of the PV device. However, the encapsulation substrate typically contains a hole that enables connection of the photovoltaic device to lead wires for the collection of the DC electricity created by the PV device. The presence of the hole in the encapsulation substrate can induce a weak point in the device. For example, the hole in the encapsulation substrate can serve as an entry point for water to diffuse into the device (e.g., water ingress). Also, the PV device may be particularly susceptible to hail damage (e.g., cracking) in the window glass in the area at or near the encapsulation hole. This weakness can be exaggerated when the window glass is made from a specialty glass and/or a relatively thin glass.

BRIEF DESCRIPTION OF THE INVENTION

Aspects and advantages of the invention will be set forth in part in the following description, or may be obvious from the description, or may be learned through practice of the invention.

A photovoltaic device is generally provided that, in one embodiment, includes a transparent substrate and a thin film stack on the transparent substrate. The thin film stack generally defines a plurality of photovoltaic cells connected in series to each other with the series extending from a first terminal cell to a second terminal cell. A first busbar is electrically connected to the first terminal cell; and a second busbar is electrically connected to the second terminal cell. An encapsulation substrate is on the plurality of thin film layers and defines a first connection aperture positioned over the first busbar and a second connection aperture positioned over the second bus bar. A first electrical connector is positioned on the encapsulation substrate and is electrically connected to the first busbar through the first connection aperture. Similarly, a second electrical connector is positioned on the encapsulation substrate and is electrically connected to the second busbar through the second connection aperture. In one particular embodiment, the first electrical connector comprises a female pin positioned within a first housing, and the second electrical connector comprises a male pin positioned within a second housing.

A solar array is also generally provided and can include a plurality of photovoltaic devices (such as described above) with a first photovoltaic device connected in series to a second photovoltaic device via a connection cable. The connection cable can include an electrical wire defining a first end and a second end; a first plug connected to the electrical wire at the first end and electrically connected with the female pin of the first electrical connector of a first photovoltaic device; and a second plug connected to the electrical wire at the second end and electrically connected with the male pin of the second electrical connector of a second photovoltaic device such that the first photovoltaic device is electrically connected in series to the second photovoltaic device.

A kit is also generally provided for forming a solar array. In one embodiment, the kit can include a photovoltaic device (such as described above) and a connection cable. The connection cable, in one embodiment, includes an electrical wire defining a first end and a second end; a first plug connected to the electrical wire at the first end and configured to be electrically connected with the female pin of the first electrical connector; and a second plug connected to the electrical wire at the second end and configured to be electrically connected with the male pin of the second electrical connector.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Figure 1:
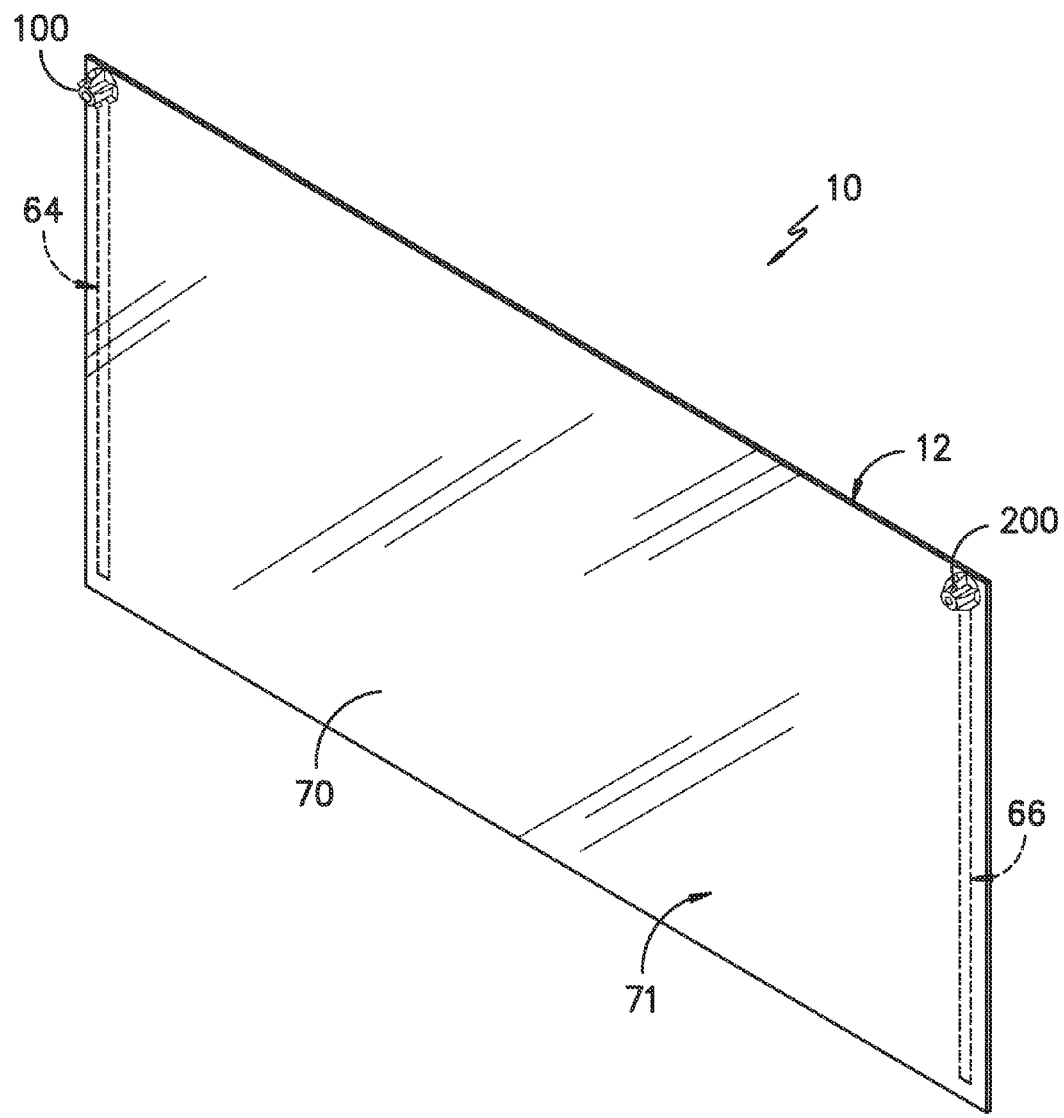
FIG. 1 shows a perspective view of an exemplary photovoltaic device according to one embodiment.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers, unless otherwise specifically noted. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "µm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Photovoltaic (PV) devices are generally provided that utilize an integrated power connector to collect the power (current and voltage) out of the PV device. Such PV devices can be connected together in series to form an array through an electrical cable.

FIG. 1 shows an exemplary PV device 10 that includes a transparent substrate 12 and an encapsulation substrate 70. A thin film stack 11 (e.g., formed by a plurality of thin film layers) is positioned between the transparent substrate 12 and an encapsulation substrate 70. As more particularly shown in FIGS. 8 and 9, the thin film stack generally defines a plurality of photovoltaic cells 28 connected in series to each other and extending from a first terminal cell 54 to a second terminal cell 56, with a first busbar 64 electrically connected to the first terminal cell 54 and a second busbar 66 electrically connected to the second terminal cell 56.

Figure 3:
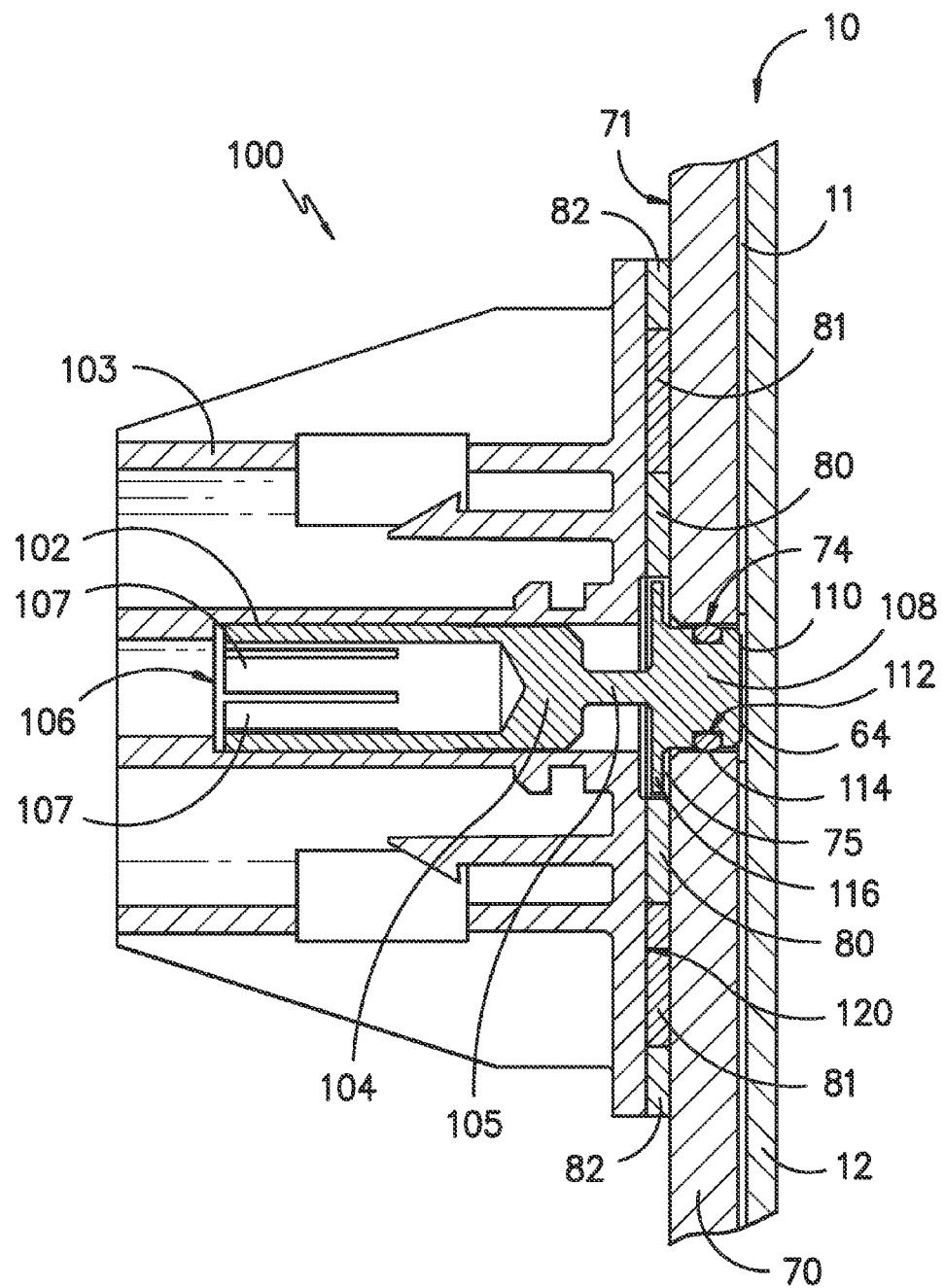
FIG. 3 shows a cross-sectional view of the first electrical connector shown in FIG. 2 connected to a first busbar within the photovoltaic device shown in FIG. 1.
Figure 5:
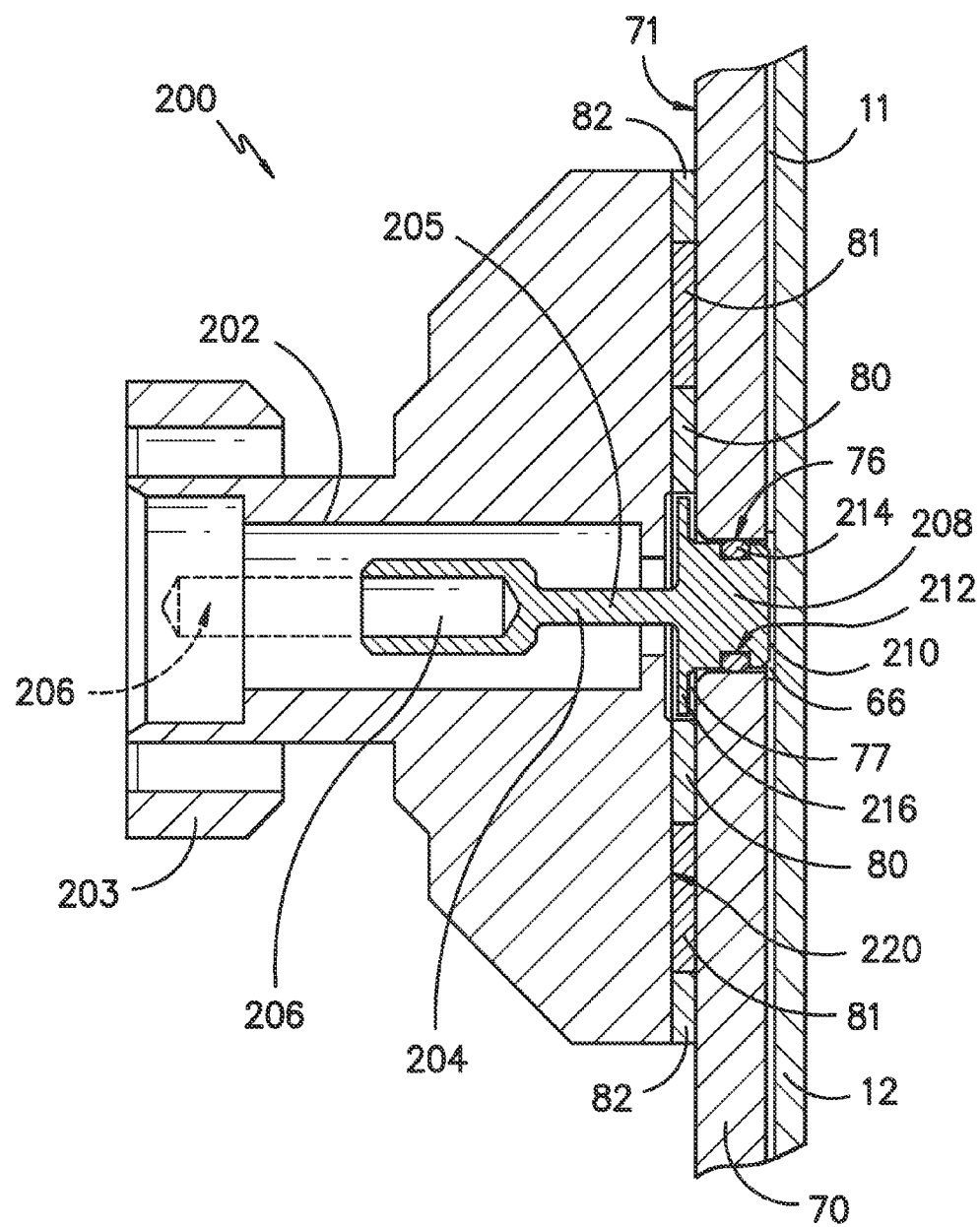
FIG. 5 shows a cross-sectional view of the second electrical connector shown in FIG. 4 connected to a second busbar within the photovoltaic device shown in FIG. 1.
Figure 6:
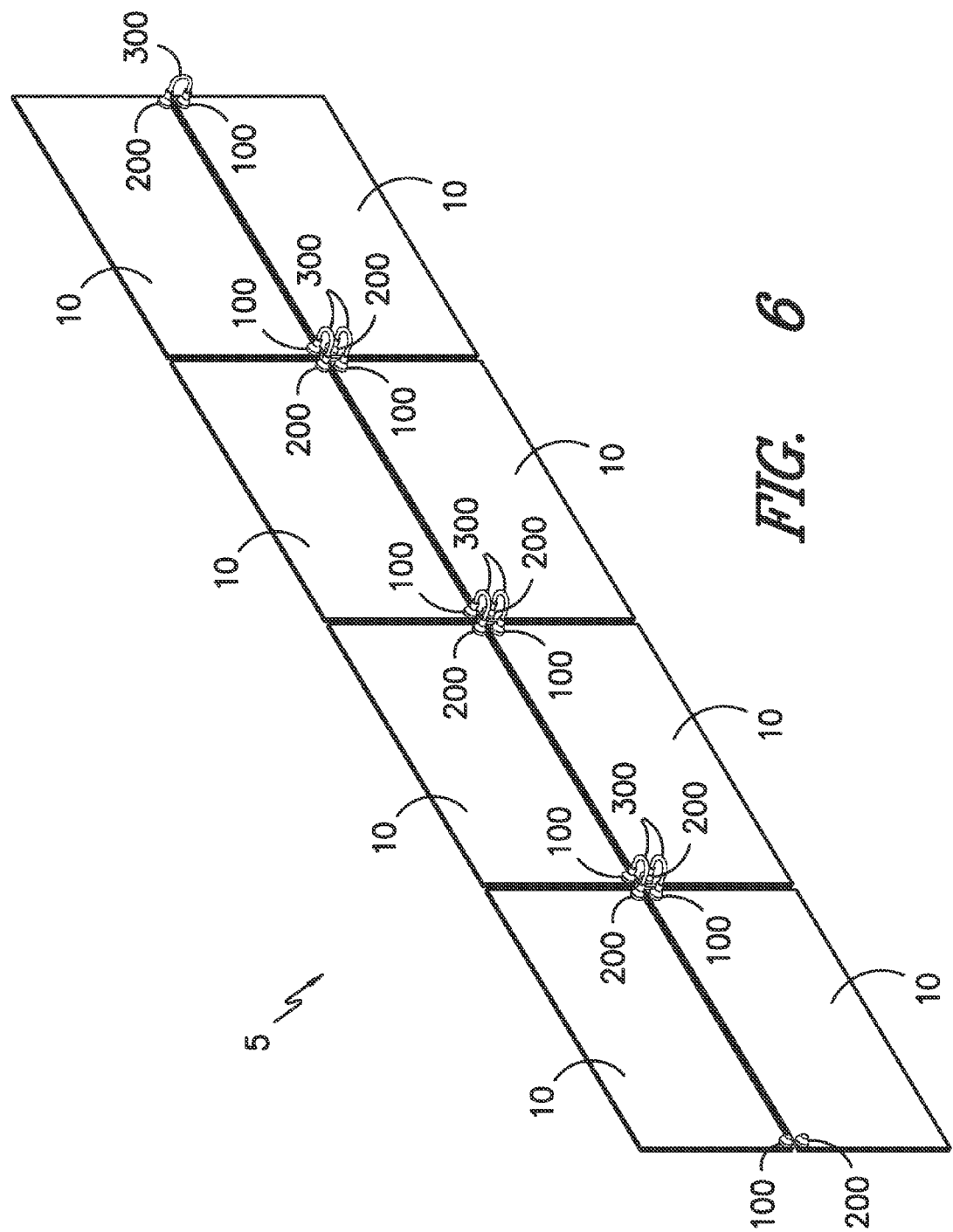
FIG. 6 shows a perspective view of a plurality of photovoltaic devices electrically connected together in series.
Figure 7:
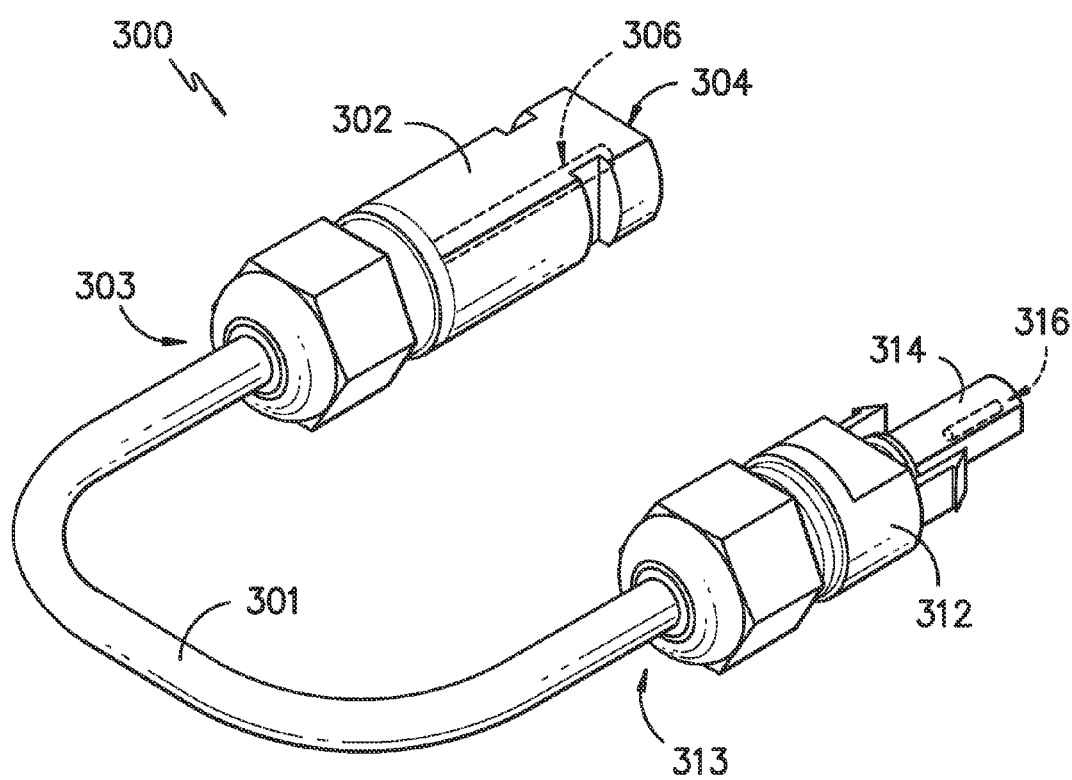
FIG. 7 shows perspective view an exemplary connection cable having a first plug compatible with the first electrical connector shown in FIG. 2 and a second plug compatible with the second electrical connector shown in FIG. 4.
Figure 9:
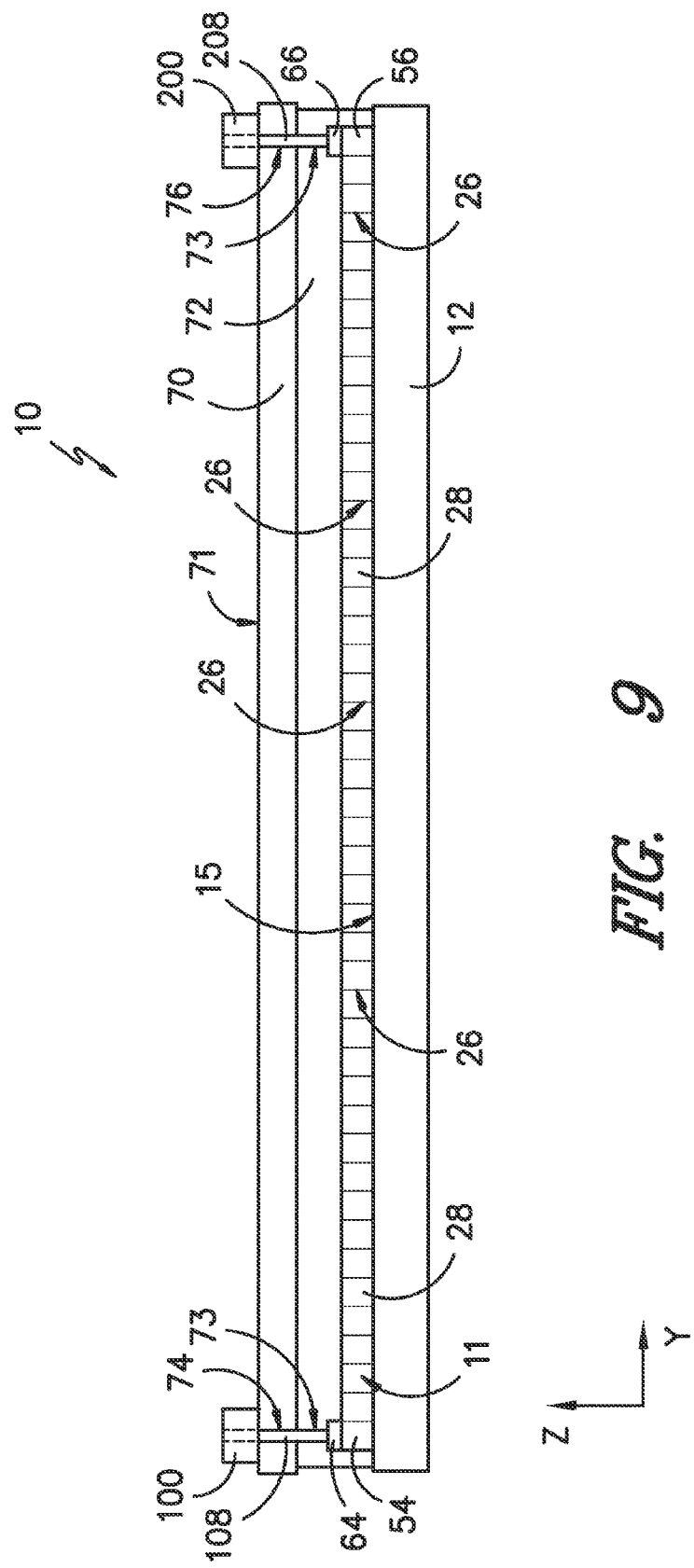

A first electrical connector 100 is positioned on the encapsulation substrate 70 and is electrically connected to the first busbar 64 through a first connection aperture 74 (FIGS. 3 and 9). Similarly, a second electrical connector 200 is positioned on the encapsulation substrate 70 and is electrically connected to the second busbar 66 through a second connection aperture 76 (FIGS. 5 and 9). Both of the electrical connectors 100, 200 include a pin 104, 204 connecting to the respective busbar 64, 66 on the inside of the device 10. Additionally, the pin 104, 204 creates a seal between the pin 104, 204 and the respective connection aperture 74, 76 in the encapsulation substrate 70 (FIGS. 3, 5, and 9). Finally, the pin 104, 204 is also configured to be mated with the respective plug 302, 312 for power collection (FIGS. 6-7).

With this configuration, potting material that is generally required with conventional j-boxes is eliminated while still sufficiently sealing the connection apertures 74, 76 in the encapsulation substrate 70. Additionally, by utilizing a very small hole and by filling it with the pin, the risk of breakage from a hail strike is reduced or possibly eliminated, when compared to a conventional J-box device. Also, the placement of the connection apertures 74, 76 away from the high module bending stress area and along the sides or corners of the encapsulation substrate 70 can reduce the stress within the device 10, especially when compared to the typical hole location for a j-box in the middle of the module where the bending stress can be high. Finally, the use of insulation tape, foil tape, potting material, and/or hole seal material is eliminated, which can lead to significant cost savings in both materials and manufacturing processes.

As shown in FIG. 1, each electrical connector 100, 200 is positioned in close proximity to a corner of the device 10 over the respective busbar 64, 66. Though shown as positioned along a common edge (i.e., the top edge shown in FIG. 1), the electrical connectors 100, 200 can be positioned on diagonal corners from each other. Such positioning along the corners of the device 10, allow for the connection apertures 74, 76 to be away from the high module bending stress area (in the middle of the device) and along the corners of the encapsulation substrate 70.

In one embodiment, each electrical connector 100, 200 is electrically connected to in close proximity to an end of the respective underlying busbar 64, 66. For example, if the busbar 64 has a total length (L) in the x-direction, the electrical connector 100 can be electrically connected to the busbar 64 at a location from one end of the busbar 64 that is no more than about 10% of the total length (L). That is, if the busbar 64 has a total length of about 600 mm, then the electrical connector 100 can be electrically connected to the busbar 64 within about 60 mm of one end of the busbar 64. Similarly, if the busbar 66 has a total length (L) in the x-direction, the electrical connector 200 can be electrically connected to the busbar 66 at a location from one end of the busbar 66 that is no more than about 10% of the total length (L).

Figure 8:
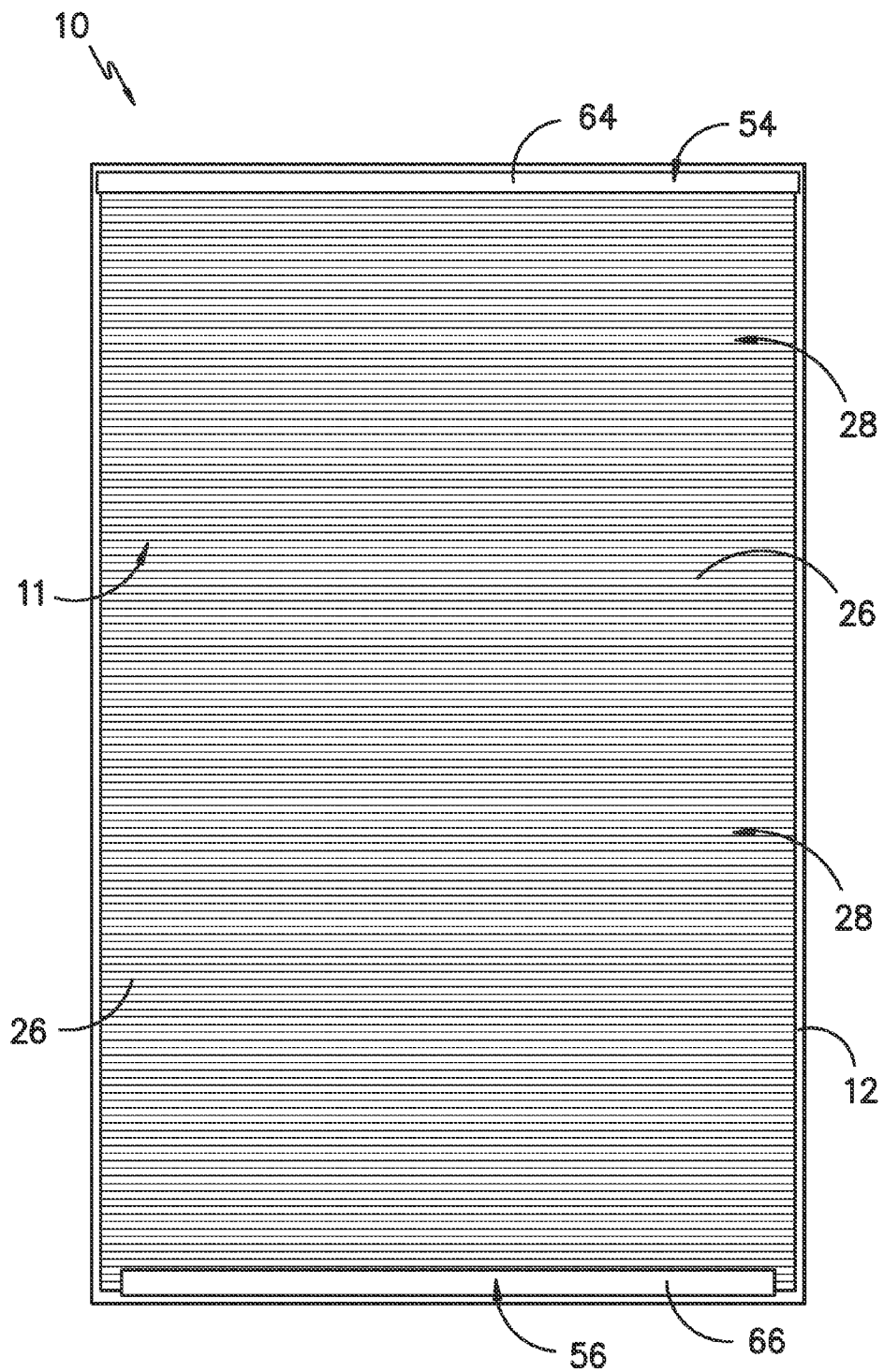
FIG. 8 shows a general schematic of an exemplary thin film photovoltaic device prior to lamination to an encapsulation substrate; and, FIG. 9 shows a cross-sectional view of the exemplary thin film photovoltaic device of FIG. 8 laminated to an encapsulation substrate.

Although described with respect to the embodiment of FIGS. 8 and 9, the present disclosure is not intended to be limited to any particular photovoltaic device design. It is contemplated that other photovoltaic device designs can be utilized.

FIGS. 8 and 9 show an exemplary thin film photovoltaic device 10 particularly suitable for use with the first and second electrical connectors 100, 200, respectively. The device 10 includes a film stack 11 that defines a plurality of photovoltaic cells 28 separated by scribe lines 26. It is noted that each of the scribe lines 26 shown can be multiple scribe lines depending on the configuration of the device 10. For example, each of the scribe lines 26 can actually be three scribe lines: a first isolation scribe, a series connecting scribe and a second isolation scribe. However, due to the presence of a metal contact layer covering the first isolation scribe and filling the series connecting scribe, only the second isolation scribe lines are visible and thus appear to be a single scribe line 26 in the device 10.

As stated, the thin film stack 11 defines individual solar cells 28 (also referred to as photovoltaic cells) separated by scribes 26 to collectively form a plurality of serially connected solar cells. Specifically, the individual photovoltaic cells 28 are electrically connected together in series. In one particular embodiment, the thin film stack 11 includes a transparent conductive oxide layer (e.g., cadmium stannate or a stoichiometric variation of cadmium, tin, and oxygen; indium tin oxide, etc.) on the inner surface 15 of the transparent substrate 12 (serving as a superstrate), an optional resistive transparent buffer layer (e.g., a combination of zinc oxide and tin oxide, etc.) on the transparent conductive oxide layer, an n-type window layer (e.g., comprising cadmium sulfide) on the transparent conductive oxide layer, an absorber layer (e.g., comprising cadmium telluride) on the n-type window layer, and a back contact on the absorber layer (e.g., a graphite layer and/or a metal contact layer). It is, however, to be understood that other material combinations could instead be used to form the back contact and that such combinations are considered to be within the scope of presently disclosed device. Other layers may also be present in the thin film stack 11. For example, index matching layers may be present between the transparent conductive oxide layer and the inner surface of the superstrate. Additionally, an oxygen getter layer may be present in the thin film stack, such as adjacent to the transparent conductive oxide layer (e.g., between the transparent conductive oxide layer and the optional resistive transparent buffer layer).

The plurality of serially connected solar cells 28 are between a first terminal cell 54 and a second terminal cell 56. As shown, the first and second terminal cells 54, 56 are positioned on opposite ends of the plurality of serially connected solar cells 28 in the y-direction of the device 10. In one embodiment, the first terminal cell 54 is a dead cell. The back contact of the dead cell 54 serves as an electrical connector for the device 10, while the TCO layer of the terminal cell 56 serves as the opposite electrical connector for the device 10. As such, the dead cell 54 does not produce a charge in the thin film stack 11, while the terminal cell 56 may.

FIG. 8 generally shows a top view of an exemplary thin film photovoltaic device 10 defining a plurality of photovoltaic cells 28 separated by scribes 26. The scribes 26 can be, in one embodiment, substantially parallel to each other such that the photovoltaic cells 28 are substantially the same size. As shown, each of the scribes 26 is generally oriented in the x-direction.

Busbars 64, 66 can then be attached over each terminal cell 54, 56, respectively, of the photovoltaic device 10 to serve as an opposite electrical connections. The encapsulation substrate 70 can be adhered to the photovoltaic device 10 via an adhesive layer 72. The adhesive layer 72 is generally positioned over the busbars 64, 66 and the thin film stack 11.

The adhesive layer 72 generally defines adhesive gaps 73 that corresponds to the connection apertures 74, 76 defined by the encapsulation substrate 70. As such, a first lead bar 108 of the first electrical connector 100 and a second lead bar 208 of the second electrical connector 200 can reach through and directly contact the exposed busbars 64, 66, respectively, for electrical connection thereto. Additionally, the adhesive layer 72 can generally provide mechanical stability within the connection apertures 74, 76 and can also protect the thin film stack 11 and attach the encapsulation substrate 70 to the device 10. In one embodiment, the adhesive layer 72 can be constructed from ethylene vinyl acetate (EVA), polyvinyl butyral (PVB), silicone based adhesives, or other adhesives which are configured to prevent moisture from penetrating the device.

Figure 2:
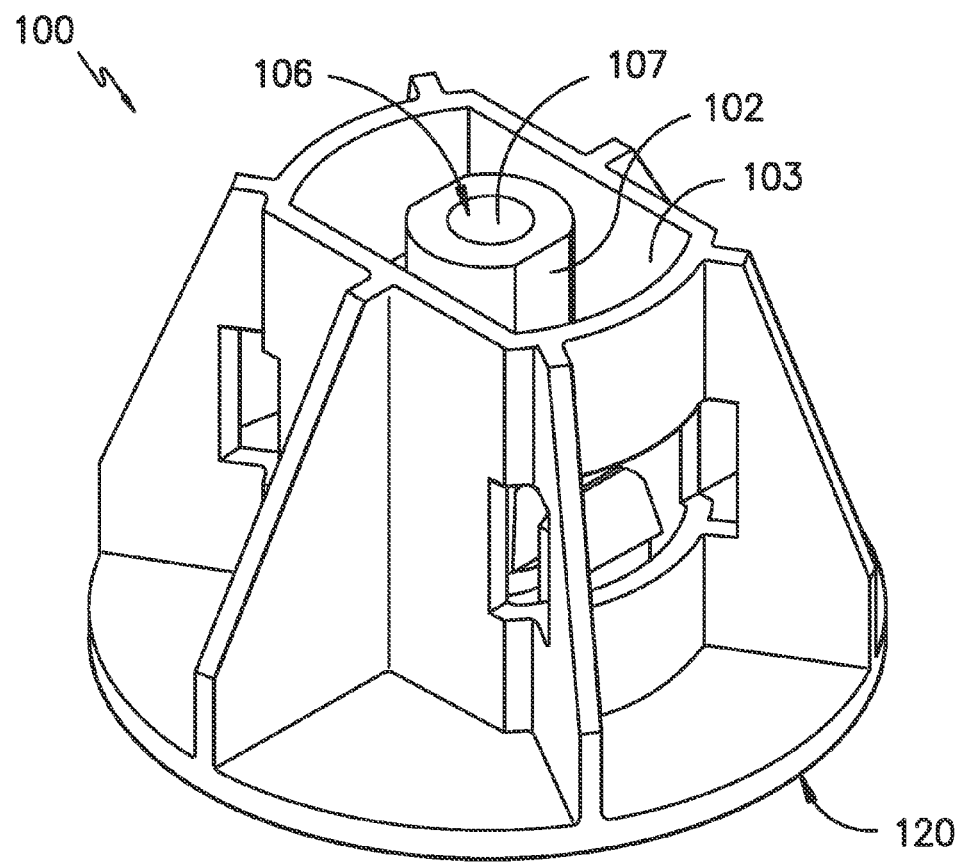
FIG. 2 shows a perspective view of a first electrical connector for use with the exemplary photovoltaic device of FIG. 1.

Referring to FIGS. 2 and 3, one exemplary embodiment of the first electrical connector 100 is shown defining a first housing 102 that includes a female pin 104. The female pin 104 defines a cavity 106 that is configured to receive within and electrically connect to a male insert 306 of a first plug 302 of an electrical cable 300 (FIG. 7). The first housing 102 also includes a casing 103 within which the first plug 302 is secured upon connection thereto in order to secure the electrical connection of the female pin 104 to the male insert 306.

The female pin 104 of the first electrical connector 100 also defines a first lead bar 108 extending through the first connection aperture 74 and electrically connected to the first busbar 64. As shown, the first lead bar 108 is electrically connected to the first busbar 64 via a meltable conductive material 110 in order to secure the electrical connection. Suitable meltable conducive materials can generally include any suitable solder material, including but not limited to, tin, lead, antimony, bismuth, indium, silver, copper, cadmium, or alloys thereof, or mixtures thereof. Generally, the solder material may be configured to melt at a solder temperature of about 150° C. to about 250° C. (e.g., a soft solder) to ensure that melting the solder can occur without significantly affecting the other components of the device 10. Both lead-based solders and non-lead-based solders may prove useful for this application.

In one embodiment, the first lead bar 108 defines a first radial gland 112 that circumferentially surrounds the first lead bar 108 in the area positioned within the connection aperture 74 of the encapsulation substrate 70. A first o-ring 114 is positioned within the first radial gland 112 to seal the first lead bar 108 within the first connection aperture 74 of the encapsulation substrate 70. This positioning of the first o-ring 114 augments the water-proofing seal between the first electrical connector 100 and the device 10.

Additionally, the female pin 104 also, in one embodiment, defines a first lip 116 that circumferentially surrounds the first lead bar 108 in the area adjacent to the outer surface 71 of the encapsulation substrate 70 and is adhered thereto. The first lip 116 helps to secure the first electrical connector 100 to the device 10, but also ensures that the first lead bar 108 is not inserted too far into the connection aperture 74 during the manufacturing process (which could lead to damage to the underlying first busbar 64, thin film stack 11, and/or transparent substrate 12).

As shown, the female pin 104 includes a middle link 105 between the cavity 106 (defined by cavity walls 107 of the female pin 104) and the first lead bar 108. The middle link 105 ensures electrical connection throughout the female pin 104 by connecting the cavity walls 107 to the first lead bar 108. Thus, upon insertion of the male insert 306 into the cavity 106, an electrical connection is made between the first plug 302 of the electrical cable 300 to the first busbar 64 of the PV device 10.

As stated, the first housing 102 includes a casing 103 within which the first plug 302 is secured in order to secure the electrical connection of the female pin 104 to the male insert 306. For example, the first housing 102 can be configured to connect to a male MC4-type connector plug serving as the first plug 302, such as shown in FIG. 7.

Figure 4:
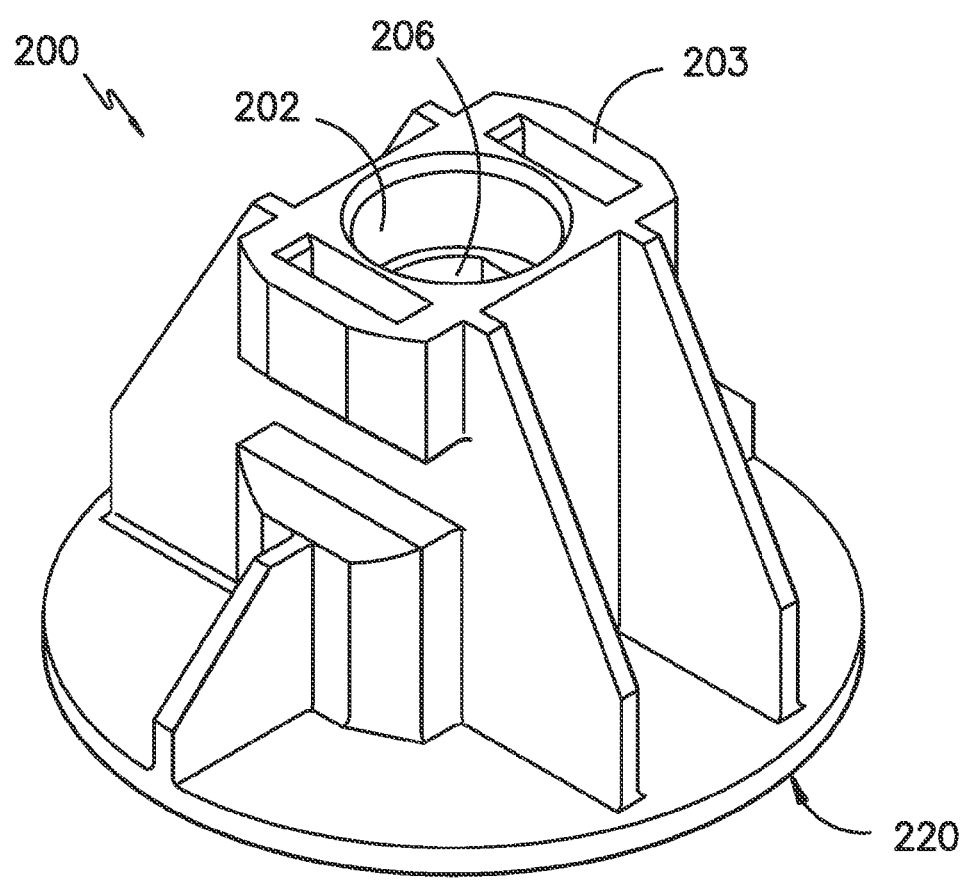
FIG. 4 shows a perspective view of a second electrical connector for use with the exemplary photovoltaic device of FIG. 1.

Referring to FIGS. 4 and 5, one exemplary embodiment of the second electrical connector 200 is shown defining a second housing 202 that includes a male pin 204. The male pin 204 includes a rod 206 configured to insert within and electrically connect to a female cavity 316 defined within a second plug 312 of the electrical cable 300 (FIG. 7). The second housing 202 also includes a casing 203 about which the second plug 312 is secured upon connection thereto in order to secure the electrical connection of the male pin 204 to the female cavity 316.

The male pin 204 of the second electrical connector 200 also defines a second lead bar 208 extending through the second connection aperture 76 and electrically connected to the second busbar 66. As shown, the second lead bar 208 is electrically connected to the second busbar 66 via a meltable conductive material 210 in order to secure the electrical connection, such as discussed above with respect to meltable conductive material 110 (e.g., a solder material).

In one embodiment, the second lead bar 208 defines a second radial gland 212 that circumferentially surrounds the second lead bar 208 in the area positioned within the connection aperture 76 of the encapsulation substrate 70. A second o-ring 214 is positioned within the second radial gland 212 to seal the second lead bar 208 within the second connection aperture 76 of the encapsulation substrate 70. This positioning of the second o-ring 214 augments the water-proofing seal between the second electrical connector 200 and the device 10.

Additionally, the male pin 204 also, in one embodiment, defines a second lip 216 that circumferentially surrounds the second lead bar 208 in the area adjacent to the outer surface 71 of the encapsulation substrate 70 and is adhered thereto. The second lip 216 not only helps to secure the second electrical connector 200 to the device 10, but also ensures that the second lead bar 208 is not inserted too far into the connection aperture 76 during the manufacturing process (which could lead to damage to the underlying second busbar 66, thin film stack 11, and/or transparent substrate 12).

As shown, the male pin 204 includes a middle link 205 between the rod 206 and the second lead bar 208. The middle link 205 ensures electrical connection throughout the male pin 204 by connecting the rod 206 to the second lead bar 208. Thus, upon insertion of the female insert 316 into the housing 202, the male pin 204 fits and is electrically connected to the female cavity 316 to establish an electrical connection between the second plug 312 of the electrical cable 300 and the second busbar 66 of the PV device 10.

As stated, the second housing 202 includes a casing 203 within which the second plug 312 is secured in order to secure the electrical connection of the male pin 204 to the female cavity 316. For example, the second housing 202 can be configured to connect to a female MC4-type connector plug serving as the second plug 312, such as shown in FIG. 7.

The housings 102, 202 and/or casings 103, 203 of the electrical connectors 100, 200, respectively, can be constructed from any suitable material that provides sufficient stiffness within and around the connection apertures 74, 76, such as an injection molded material (e.g., a thermoset material, a thermoplastic material, molded plastic material, a molded hard rubber material, or a combination thereof).

A sealant 75, 77 is shown within and about (e.g., circumferentially surrounding) the first and second connection aperture 74, 76, respectively, to further seal the first and second lead bars 108, 208 therein. The sealant can, in one embodiment, be an epoxy material that can help secure the electrical connectors 100, 200 to the outer surface 71 and to inhibit water ingress into the connection aperture 74, 76, respectively.

In addition to the lead bars 108, 208 secured within the connection apertures 74, 76, respectively, the inner surfaces 120, 220 of the electrical connectors 100, 200 can be secured to the outer surface 71 of the encapsulation substrate 70. As shown in FIGS. 3 and 5, respectively, the inner surfaces 120, 220 of the electrical connectors 100, 200 are adhered to the outer surface 71 via a plurality of adhesive bands 80, 81, 82. As shown, each of the adhesive bands 80, 81, 82 can circumferentially surround the connection apertures 74, 76 so as to provide an additional seal to the connection between the electrical connectors 100, 200 and the device 10. In one embodiment, the adhesive bands 80, 81, 82 include an adhesive or tape material that also helps seal the electrical connectors 100, 200 to the outer surface 71 to inhibit water ingress into the connection aperture 74, 76, respectively. The construction of each adhesive bands 80, 81, 82 can be independently selected, and can include a silicone rubber material (e.g., a room temperature vulcanizing (RTV) silicone), an adhesive double-sided tape (e.g., VHB™ Tape available from 3M Co., St. Paul, Minn.), etc. In one embodiment, adhesive bands 80, 82 include a RTV silicone, and adhesive band 81 includes VHB™ tape available from 3M Co. (St. Paul, Minn.).

The connection apertures 74, 76 generally have a perimeter defined by aperture walls of the encapsulation substrate 70. In one embodiment, the aperture wall can be coupled to the lead bars 108, 208 and/or the o-rings 114, 214 to seal the electrical connectors 100, 200 to the device 10 at the respective connection apertures 74, 76. In one embodiment, the aperture walls can be beveled or chamfered, and the lead bars 108, 208 can be configured to couple with the aperture wall.

FIG. 6 shows an array 5 that includes a plurality of photovoltaic devices 10 connected to each other in series via cables 300. As shown, each photovoltaic device 10 is connected in series to another photovoltaic device 10 via a connection cable 300. As shown, the electrical cable 300 connects the first electrical connector 100 of one device 10 to a second electrical connector 200 of another device. Due to the different configuration of the first and second electrical connectors 100, 200 (i.e., female pin 104 and male pin 204, respectively), it is insured that the array 5 is properly connected in series since the electrical cables 300 do not allow for improper connection.

FIG. 7 shows an exemplary electrical cable 300 that includes a wire 301 connected to a first plug 302 at its first end 303 and a second plug 312 at its second end 313. As discussed above, the electrical cable 300 is one example of a suitable connection between devices 10 utilizing a male MC4-type connector plug serving as the first plug 302 and a female MC4-type connector plug serving as the second plug 312. Other configurations of the plugs 302, 312 could also be utilized with suitable casings 103, 203, respectively.

Referring again to FIGS. 8 and 9, the transparent substrate 12 can be, in one embodiment, a "superstrate," as it can be the substrate on which the subsequent layers are formed even though it faces upward to the radiation source (e.g., the sun) when the photovoltaic device 10 is in use. The transparent substrate 12 can be a high-transmission glass (e.g., high transmission borosilicate glass), low-iron float glass, or other highly transparent glass material. The glass is generally thick enough (e.g., from about 0.5 mm to about 10 mm thick) to provide support for the subsequent film layers, and is substantially flat to provide a good surface for forming the subsequent film layers. In one embodiment, the transparent substrate 12 can be a low iron float glass containing less than about 0.015% by weight iron (Fe), and may have a transmissiveness of about 0.9 or greater in the spectrum of interest (e.g., wavelengths from about 300 nm to about 900 nm). In another embodiment, a high strain-point glass, such as borosilicate glass, may be utilized so as to better withstand high temperature processing. For example, the transparent substrate 12 can be a relatively thin sheet of borosilicate glass, such as having a thickness of about 0.5 mm to about 2.5 mm.

In one particular embodiment, the encapsulation substrate 70 is a glass substrate, such as those discussed above with respect to the transparent substrate 12. For example, in one embodiment, the transparent substrate 21 can be a borosilicate glass having a thickness of about 0.5 mm to about 2.5 mm, while the encapsulation substrate 70 is a low iron float glass having a thickness that is greater than that of the transparent substrate 12 (e.g., about 3 mm to about 10 mm).

Other components and features (not shown) can be included in the exemplary device 10, such as bus bars, external wiring, laser etches, etc. For example, edge sealing layers can be applied around the edges of the device 10 to seal the transparent substrate 12 to the encapsulation substrate 70 along each edge.

Methods of manufacturing the devices 10 and arrays and the connectors 100, 200 are also encompassed by the present disclosure. Additionally, methods are provided for positioning the connectors 100, 200 into a photovoltaic device 10. Finally, methods are provided for connecting a plurality of devices 10 into an array is also provided.

Kits are also disclosed that generally include at least one PV device 10 that includes first and second electrical connectors 100, 200 (e.g., FIGS. 1, 3, 5-6, and 8-9) and at least one cable 300 (e.g., FIG. 7).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A photovoltaic device, comprising:
   a transparent substrate;
   a thin film stack on the transparent substrate, wherein the thin film stack defines a plurality of photovoltaic cells connected in series to each other, the series extending from a first terminal cell to a second terminal cell;
   a first busbar electrically connected to the first terminal cell;
   a second busbar electrically connected to the second terminal cell;
   an encapsulation substrate on the thin film stack;
   a first connection aperture in the encapsulation substrate, wherein the first connection aperture is positioned over the first busbar;
   a second connection aperture in the encapsulation substrate, wherein the second connection aperture is positioned over the second busbar;
   a first electrical connector positioned on the encapsulation substrate and electrically connected to the first busbar through the first connection aperture, the first electrical connector comprising a female pin within a first housing, the female pin defining a first lead bar extending through the first connection aperture and connected to the first busbar, wherein the female pin houses a cavity defined by cavity walls, the cavity being configured to accept a male insert of a first plug of an electrical cable, wherein the cavity walls are electrically connected to the first lead bar;
   a second electrical connector positioned on the encapsulation substrate and electrically connected to the second busbar through the second connection aperture, the second electrical connector comprising a male pin within a second housing, the male pin defining a second lead bar extending through the second connection aperture and connected to the second busbar, wherein the male pin defines a rod configured for insertion into a female cavity of a second plug of the electrical cable, the rod being electrically connected to the second lead bar; and
   at least one of a first O-ring around the first lead bar and a second O-ring around the second lead bar;
   wherein the first O-ring is in direct physical contact with the encapsulation substrate and wherein the second O-ring is in direct physical contact with the encapsulation substrate; and
   wherein the female pin fills and creates a seal in the first connection aperture, and the male pin fills and creates a seal in the second connection aperture.

2. The photovoltaic device as in claim 1, wherein the first plug of the electrical cable is physically and electrically incompatible with the second housing, and wherein the second plug of the electrical cable is physically and electrically incompatible with the first housing.

3. The photovoltaic device as in claim 1, wherein the first housing comprises a casing within which the first plug is secured.

4. The photovoltaic device as in claim 1, wherein the second housing comprises a casing about which the second plug is secured.

5. The photovoltaic device as in claim 1, wherein the first lead bar is soldered to the first busbar.

6. The photovoltaic device as in claim 1, wherein:
   the cavity walls are electrically connected to the first lead bar through a middle link in the female pin; and
   the first lead bar defines a first radial gland that circumferentially surrounds the first lead bar within the first connection aperture, wherein the first O-ring is positioned within the first radial gland to seal the first lead bar within the first connection aperture.

7. The photovoltaic device as in claim 1, wherein the female pin defines a first lip circumferentially surrounding the first lead bar, the first lip adhered to an outer surface of the encapsulation substrate.

8. The photovoltaic device as in claim 1, wherein the second lead bar is soldered to the second busbar.

9. The photovoltaic device as in claim 1, wherein:
   the rod is electrically connected to the second lead bar through a middle link in the male pin; and
   the second lead bar defines a second radial gland that circumferentially surrounds the second lead bar in the second connection aperture, wherein the second O-ring is positioned within the second radial gland to seal the second lead bar within the second connection aperture.

10. The photovoltaic device as in claim 1, wherein the male pin defines a second lip circumferentially surrounding the second lead bar, the second lip adhered to an outer surface of the encapsulation substrate.

11. A solar array, comprising: a plurality of photovoltaic devices including at least a first photovoltaic device as in claim 1 and a second photovoltaic device as in claim 1, wherein the first photovoltaic device is connected in series to the second photovoltaic device via the electrical cable defining the first plug at a first end and the second plug at a second end,
   wherein the first plug is electrically connected with the female pin of the first electrical connector of the first photovoltaic device, and
   wherein the second plug is electrically connected with the male pin of the second electrical connector of the second photovoltaic device such that the first photovoltaic device is electrically connected in series to the second photovoltaic device.

12. The solar array as in claim 11, wherein the first plug comprises a male pin extending into the cavity defined within the female pin of the first electrical connector of the first photovoltaic device, and wherein the second plug comprises a female pin into which the rod defined by the male pin of the second electrical connector of the second photovoltaic device extends.

13. A kit for forming a solar array, the kit comprising:
the photovoltaic device as in claim 1; and,
the electrical cable comprising:
 an electrical wire defining a first end and a second end;
 the first plug connected to the electrical wire at the first end, wherein the first plug is configured to be electrically connected with the female pin of the first electrical connector; and
 the second plug connected to the electrical wire at the second end, wherein the second plug is configured to be electrically connected with the male pin of the second electrical connector.

14. The kit as in claim 13, wherein the first plug of the electrical cable is physically and electrically incompatible with the second housing, and wherein the second plug of the electrical cable is physically and electrically incompatible with the first housing.

\* \* \* \* \*